(12) United States Patent
Mascolo et al.

(10) Patent No.: US 9,997,691 B2
(45) Date of Patent: *Jun. 12, 2018

(54) 3D INTEGRATED THERMOELECTRIC GENERATOR OPERATING IN AN OUT-OF-PLANE HEAT FLUX CONFIGURATION WITH INTERNAL VOIDS AND HEAT CONDUCTION PATHS CONDITIONING VIAS

(71) Applicant: CONSORZIO DELTA TI RESEARCH, Milan (IT)

(72) Inventors: Danilo Mascolo, Bologna (IT); Giuseppe Latessa, Rome (IT); Simone Di Marco, Florence (IT); Marco Giusti, Rome (IT)

(73) Assignee: CONSORZIO DELTA TI RESEARCH, Milan (IT)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/470,273

(22) Filed: Mar. 27, 2017

(65) Prior Publication Data

US 2017/0200879 A1    Jul. 13, 2017

Related U.S. Application Data

(63) Continuation-in-part of application No. PCT/IB2015/057353, filed on Sep. 24, 2015.

(30) Foreign Application Priority Data

Oct. 9, 2014   (IT) .......................... MI2014A001768

(51) Int. Cl.
   *H01L 35/28*   (2006.01)
   *H01L 35/10*   (2006.01)
   (Continued)

(52) U.S. Cl.
   CPC .............. *H01L 35/10* (2013.01); *H01L 35/22* (2013.01); *H01L 35/34* (2013.01)

(58) Field of Classification Search
   CPC ........ H01L 35/30; H01L 35/32; H01L 35/325
   See application file for complete search history.

(56) References Cited

U.S. PATENT DOCUMENTS 7,531,739 B1   5/2009   Moczygemba
7,875,791 B2   1/2011   Leonov et al.
(Continued)

FOREIGN PATENT DOCUMENTS

EP   1083610 A1   3/2001
JP   H04101412 A   4/1992
(Continued)

OTHER PUBLICATIONS

International Search Report and Written Opinion for International Application No. PCT/IB2015/057194 (10 Pages) (dated Oct. 30, 2015).

(Continued)

*Primary Examiner* — Eli Mekhlin
(74) *Attorney, Agent, or Firm* — Lucas & Mercanti, LLP

(57) ABSTRACT

Dices of integrated Z-device structures on a substrate wafer of a 3D integrated thermo-electric generator (iTEG) may be stacked in a tri-dimensional heterogeneous integration mode, without or with interposer wafer dices, in coherent thermal coupling among them. Through silicon vias (TSVs) holes through the thickness of the semiconductor crystal of substrate of the dices of integrated Z-device structures in geometrical projection correspondence with valley bottom metal junction contacts, and through silicon vias (TSVs) holes through the thickness of the semiconductor crystal of interposer dices, in geometrical projection correspondence with the hill-top metal junction contacts of the coupled (Continued)

Z-device structures, have a copper or other good heat conductor filler, form low thermal resistance heat conduction paths through the stacked Z-device structures. Thermoelectrically generated current is gathered from every integrated Z-device of a multi-tier iTEG operating in an out-of-plane heat flux configuration.

12 Claims, 4 Drawing Sheets

(51) Int. Cl.
*H01L 35/22* (2006.01)
*H01L 35/34* (2006.01)

(56) References Cited

U.S. PATENT DOCUMENTS

| | | | |
|---|---|---|---|
| 2004/0145049 A1* | 7/2004 | McKinnell | G11B 9/10 257/719 |
| 2005/0279104 A1 | 12/2005 | Leija et al. | |
| 2006/0102223 A1 | 5/2006 | Chen et al. | |
| 2006/0210790 A1* | 9/2006 | Horio | B23K 35/0244 428/323 |
| 2013/0139524 A1* | 6/2013 | Kim | F25B 21/02 62/3.7 |
| 2013/0307200 A1* | 11/2013 | Carberry | C04B 35/64 264/614 |
| 2014/0163089 A1* | 6/2014 | Chen | A61K 31/713 514/44 A |
| 2014/0167267 A1 | 6/2014 | Uzoh et al. | |
| 2014/0190542 A1* | 7/2014 | Lane | H01L 27/16 136/212 |
| 2015/0280099 A1* | 10/2015 | Boukai | H01L 35/32 136/203 |

FOREIGN PATENT DOCUMENTS

| | | |
|---|---|---|
| JP | H10303469 A | 11/1998 |
| JP | 2005328000 A | 11/2005 |
| WO | 2005001946 A1 | 1/2005 |
| WO | 2009100809 A2 | 8/2009 |
| WO | 2009125317 A2 | 10/2009 |
| WO | 2011007241 A1 | 1/2011 |
| WO | 2011073142 A1 | 6/2011 |

OTHER PUBLICATIONS

International Search Report and Written Opinion for International Application No. PCT/IB2015/057353 (12 Pages) (dated Nov. 12, 2015).

International Search Report and Written Opinion for International Application No. PCT/IB2015/057325 (12 Pages) (dated Nov. 12, 2015).

* cited by examiner

3D INTEGRATED THERMOELECTRIC GENERATOR OPERATING IN AN OUT-OF-PLANE HEAT FLUX CONFIGURATION WITH INTERNAL VOIDS AND HEAT CONDUCTION PATHS CONDITIONING VIAS

CROSS-REFERENCE TO RELATED APPLICATIONS

This application is a Continuation-In-Part of PCT/IB2015/057353, filed Sep. 24, 2015, which claims the benefit of priority of Italian Application No. MI2014A001768 filed on Oct. 9, 2014, the contents of each of which are incorporated herein by reference.

BACKGROUND

Technical Field

This disclosure relates in general to solid state thermoelectric devices, in particular to thermoelectric generators (TEGs) amenable to be fabricated with planar processing technologies and related techniques of heterogeneous or hybrid 3D integration.

Discussion of Related Prior Art

Thermoelectric generators (TEGs) are earnestly investigated as low enthalpy waste heat exploitation devices of outstanding robustness, reliability and virtually unlimited service life, besides being made of environmental friendly materials.

As power consumption of increasingly popular electronic devices is constantly minimized, TEGs begin to be considered as supplementary power source in conjunction or even in substitution of batteries or other energy storage devices like super-capacitors.

There is an increasing number of publications concerning thin film technology TEGs exploiting well established processing techniques developed in the Microelectronics and Micro-Electro-Mechanical-Systems (MEMSs), like planar processing, micromachining implant and post implant treatments, flip-chip and bonding techniques and alike.

The doctorate thesis "Silicon-Micromachined Thermoelectric Generators for Power Generation from hot gas streams" by Israel Boniche, University of Florida, 2010, and "Monolithic integration of VLS silicon nanowires into planar thermoelectric generators" by Diana Davila Pineda, Autonomous University of Barcelona, 2011, offer an extensive introductory review of state-of-the-art practices in the field of thermoelectric devices for solid state heat pumps and power generators.

The review encompasses also two families of TEGs manufactured with silicon-compatible micro and nano technologies: in devices of a first family heat flow is parallel and in the other family orthogonally to the substrate. The architectures of these integrated TEGs generally comprise a number of unit cells having n-p doped legs, arranged in such a way that the unit cells are thermally in parallel and electrically in series.

Typically, integrated TEG devices in which heath flows parallel to the substrate may have conductive legs of thermoelectrically active materials deposited over a very high thermal resistance material or a membrane, suspended several hundreds of micrometers above the substrate, or the legs of active materials themselves are free-standing [membraneless].

1. Other relevant examples are reported in:
2. Huesgen, T.; Wois, P.; Kockmann, N Design and fabrication of MEMS thermoelectric generators with high temperature efficiency. Sens. Actuators A 2008, 145-146, 423-429.
3. Xie, J.; Lee, C.; Feng, H. Design, fabrication and characterization of CMOS MEMS-based thermoelectric power generators. J. Micromech. Syst. 2010, 19, 317-324.
4. Wang, Z.; Leonov, V.; Fiorini, P.; van Hoof, C. Realization of a wearable miniaturized thermoelectric generator for human body applications. Sens. Actuators A 2009, 156, 95-102.
5. Wang, Z.; Fiorini, P.; Leonov, V.; van Hoof, C. Characterization and optimization of polycrystalline Si70% Ge30% for surface micromachined thermopiles in human body applications. J. Micromech. Microeng. 2009, doi: 10.1088/0960-1317/19/9/094011.
6. Su, J.; Leonov, V.; Goedbloed, M.; van Andel, Y.; de Nooijer, M. C.; Elfrink, R.; Wang, Z.; Vullers, R. J. A batch process micromachined thermoelectric energy harvester: Fabrication and characterization. J. Micromech. Microeng. 2010, doi: 10.1088/0960-1317/20/10/104005.
7. Yang, S. M.; Lee, T.; Jeng, C. A. Development of a thermoelectric energy harvester with thermal isolation cavity by standard CMOS process. Sens. Actuators A 2009, 153, 244-250.
8. Kao, P.-H.; Shih, P.-J.; Dai, C.-L.; Liu, M.-C. Fabrication and characterization of CMOS-MEMS thermoelectric micro generators. Sensors 2010, 10, 1315-1325.
9. Wang, Z.; van Andel, Y.; Jambunathan, M.; Leonov, V.; Elfrink, R.; Vullers, J. M. Characterization of a bulk-micromachined membraneless in-plane thermopile. J. Electron. Mater. 2011, 40, 499-503.13.
10. U.S. Pat. No. 7,875,791 B1 "Method for manufacturing a thermopile on a membrane and a membrane-less thermopile, the thermopile thus obtained and a thermoelectric generator comprising such thermopiles" Vladimir Leonov, Paolo Fiorini, Chris Van Hoof (2011)
11. Miniaturized thermopile on a membrane are also described by A. Jacquot, W. L Liu, G. Chen, J. P Flrial, A. Dauscher, B. Lenoir, in "Fabrication and Modeling of an in-plane thermoelectric micro-generator", Proceedings ICT'02. 21st International Conference on Thermoelectrics, p. 561-564 (2002).

Other examples of parallel heat flow TEG structures rely on the ability of growing or defining populations of parallel and extremely slender conductors (nanowires) with a mean diameter of few tens of nanometers on a planar substrate of low heat conductivity and in eventually stacking tile-modules to form a thermo-electrical active septum, through which heat flows in the same direction of the parallel nanowires. The articles: "A. I. Hochbaum, R. K. Chen, R. D. Delgado, W. J. Liang, E. C. Garnett, M. Najarian, A. Majumdar, and P. D. Yang, Nature 451, 163-U5 (2008)" and "A. I. Boukai, Y. Bunimovich, J. Tahir-Kheli, J.-K. Yu, W. A. Goddard Iii, and J. R. Heath, Nature 451, 168-171 (2008)"; WO2009/125317; EP1,083,610; WO2011/007241; WO2011/073142; offer a review of practices following such an approach.

U.S. Pat. No. 7,875,791 B1 (by Leonov et al.) discloses thermopiles that may be supported by a membrane layer or that may be self-supporting. Despite the apparent easy manufacturability of these devices, heat is forced to move in a complicated structure with significant thermal losses. In addition, in some cases adhesive are needed in order to assure thermal contact to a heat source at the top or the bottom surface of the initial substrate. This results in poor thermal coupling at system level, lossy thermal paths and mechanical fragilities that penalize performance of the thermopile.

A second family of TEG devices is often referred to as "out-of-plane" heat flux TEGs. They are characterized by the fact that heat flows orthogonally to the substrate. In these devices the thermoelectrically active materials are usually laid on or are part of high aspect-ratio supporting structures standing onto the substrate. Despite a more sophisticated and apparently expensive fabrication process, this configuration minimizes thermal losses, simplifies thermal coupling at system level enhancing overall performance.

Being manufactured by conventional CMOS\BiCMOS\MEMs materials and processes, the "out-of-plane" heat flux TEGs are amenable to miniaturization and integration in microelectronic and optoelectronic devices, among other applications.

Examples are reported by M. Strasser et al. in "Miniaturized Thermoelectric Generators Based on Poly-Si and Poly-SiGe Surface Micromachining", (presented in The 11th International Conference on Solid-State Sensors and Actuators, Munich, Germany, Jun. 10-14, 2001) and "Micromachined CMOS Thermoelectric Generators as On-Chip Power Supply" (presented in The 12th International Conference on Solid-State Sensors and Actuators and Microsystems, Boston, USA, Jun. 8-12, 2003).

Out-of-plane or orthogonal heat flux thin film structures are useful for innumerable applications, for example for micro power generation or for temperature management in complex integrated systems, for energy recovery or harvesting.

Electric power yield from a given heat flow and electric power yield versus the footprint area of out-of-plane or orthogonal heat flux devices of the prior art, based on a common semiconductor or any material compatible with ICs fabrication processes, are yet poor and there is a need of more efficient and power intensive devices.

SUMMARY OF THE DISCLOSURE

A significantly increased power yield per unit of footprint area of an integrated TEG and a enhanced conversion efficiency is achieved with a novel out-of-plane (i.e. orthogonal) heat flux, Z-device structure as defined in the appended claims, the content of which is intended to be integral part of this description and herein incorporated by express reference.

In the ensuing description reference will be made to a cell of a Z-device structure, which comprises: a substrate wafer, hill-top junction metal contacts and valley-bottom junction metal contacts joining juxtaposed ends of segments, alternately p-doped and n-doped, of defined thin film lines of segments of a polycrystalline semiconductor, extending over inclined opposite flanks of hills of a material of lower thermal conductivity than the thermal conductivity of said polycrystalline semiconductor, said material of lower thermal conductivity forming valleys and said hills.

In the TEG architecture of this disclosure, the internal by-pass heat transfer by heat conduction normally occurring through dielectric fillers (e.g. silicon oxide) deposited in the valleys over defined tracts or segments of sequentially alternated p-type and n-type deposited semiconductor thin-film and over metal bridges that provide electrical continuity between juxtaposed ends of defined segments of p-type and of n-type semiconductor at valley bottom junctions, between spaced hills of trapezoidal cross section, on opposite slanted flanks of which lay the defined semiconductor thin-film legs of a unit cell of a typical Z-device profile, is significantly reduced by realizing junction metal contacts and leaving void the valley spaces, no longer filled with dielectric oxide nor hosting metal bridges of high profile of electrical connection of juxtaposed ends of a p-type and an n-type leg. Preferably the internal void spaces are evacuated upon packaging the finished device.

According to a basic embodiment, spaced parallel line arrays of through silicon vias (TSVs) holes are formed through the thickness of semiconductor crystal of a first substrate silicon wafer and of at least a second silicon wafer on the top of the z-device structure, in geometrical projection correspondence respectively to valley-bottom junction metal contacts and to hill-top junction metal contacts of every electrically conductive line of internal Z-device structures Only the vias holes in geometrical projection correspondence with the hill-top junction metal contacts in the cover wafer and the vias in geometrical projection correspondence with the valley-bottom junction metal contacts in the substrate wafer are filled with copper or other good heat conductor.

According to another embodiment, dices of integrated Z-device structures on silicon wafer substrate, are stacked in a tri-dimensional heterogeneous integration with interposer dices of wafers which are thermally coupled with. Through silicon vias (TSVs) holes through the thickness of the semiconductor crystal of substrate of the dices of integrated Z-device structures in geometrical projection correspondence with valley bottom metal junction contacts, and through silicon vias (TSVs) holes through the thickness of the semiconductor crystal of the interposer dices in geometrical projection correspondence with the hill-top metal junction contacts of the coupled Z-device structures, have a copper or other good heat conductor filler, forming low thermal resistance heat conduction paths through the stacked Z-device structures.

DETAILED DESCRIPTION OF EMBODIMENTS

Figure 1:
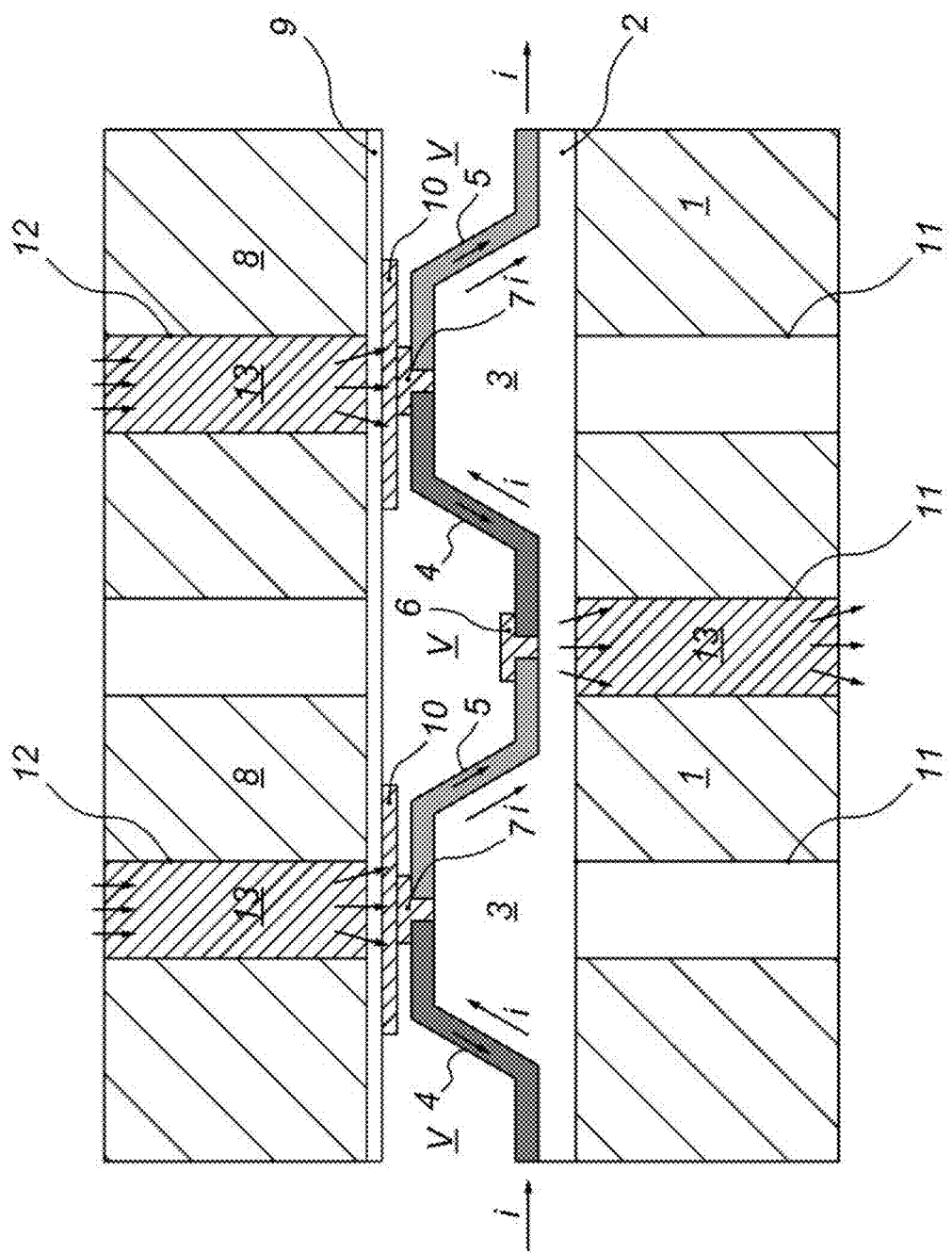
FIG. 1 is a cross sectional view of few elementary Z-device microcells of an integrated TEG of this disclosure, according to a first embodiment.

With reference to FIG. 1, commercially available silicon wafers of any size and having a thickness generally not exceeding 675 micrometers ($\mu m$), may be used.

A dielectric base layer 2 of substantially uniform thickness that may be generally comprised between 1 nanometer (nm) and 1 micrometer ($\mu m$), preferably of about 10 nm, provides a necessary bottom electrical insulation at the surface of the substrate wafer 1 without introducing a significant thermal resistance.

According to well established techniques of micro-machining processing, the structure includes parallel lines or other arrangement of spaced hills 3 of a relatively low thermal conductivity material such as, for example, of thick oxide successively grown or deposited over unmasked areas of a firstly grown base layer 2, up to a height that generally may be comprised between 0.1 and 50 μm. The typical inclined flanks of the hills 3 define valleys there between, the substantially planar bottom of which generally may have a width comprised between 0.1 and 100 μm, most preferably between 0.2 and 50 μm, similarly to the width of the top of the hills 3.

Alternatively, the hills 3 may be defined starting from a layer of deposited oxide or other material such as silicon nitride, through a succession of masking and etching steps, under controlled isotropic etching conditions, in order to slant the walls of the progressively etched valleys toward a substantially flat bottom by an angle of inclination from the base plane that preferably is comprised between 45 and 85 degrees.

Silicon oxide, deposited with varying amounts of phosphorous and/or hydrogen impurities and specific processing and post processing conditions promoting structural disorder (re: Y. S. Ju and K. E. Goodson,"*Process-dependent thermal transport properties of silicon-dioxide films deposited using low-pressure chemical vapor deposition*", AIP Journal of Applied Physics, Volume 85, Number 10, 7130-7134) is also an effective material with which hills 3 of enhanced resistance to heat conduction may be formed over the oxidized surface of the substrate wafers 1. Yet another alternative material with which hills 3 of enhanced resistance to heat conduction with two suitably inclined opposite sides may be formed over an oxidized surface of a substrate wafer is the family of nanomesh structures of phononic silicon (re: "Reduction of thermal conductivity in phononic nanomesh structures" by Jen-Kan Yu, S. Mitrovic, D. Tham, J. Varghese and J. R. Heath, Nature Nanotechnology, Vol. 5, October 2010, ©2010 Macmillan Publishers Lim.).

The material with which the hills 3 can be made, should have a high thermal resistance, in order to further penalize by-pass paths of heat flow alternative to the paths of productive heat conduction along the polycrystalline doped semiconductor thin film segments or legs 4 and 5 defined over opposite slanted surfaces of truncated rectangular pyramid shaped hills 3 or of hills with a trapezoidal cross section along one axis and straight sides or flanks orthogonal to it.

Examples of suitable materials of lower thermal conductivity than the thermal conductivity of a thermoelectrically active polycrystalline semiconductor and their respective heat conduction coefficients are reported in the following table.

| Material | Thickness [nm] | Thermal Conductivity [W m$^{-1}$ K$^{-1}$] |
|---|---|---|
| Thermal SiO$_2$ | 250 | 1.2 |
| SiO$_2$ (PECVD@300 C.) | 30-50 | 0.82 ± 0.02 |
| SiO$_2$ (PECVD@300 C.) | 90-180 | 1.00 ± 0.10 |
| SiO$_2$ (PECVD@300 C.) | >200 | ~1.2 (Bulk) |
| SiN$x$ (PECVD@300 C.) | 20-40 | 0.55 ± 0.05 |
| SiN$x$ (PECVD@300 C.) | 60-120 | 0.65 ± 0.05 |
| SiN$x$ (APCVD@900 C.) | 180 | ~1.45 |

Parallel lines of defined tracts or segments of alternately p-doped and n-doped, 4 and 5, respectively, of a polycrystalline semiconductor material such as, for example, doped Si or SiGe, deposited in form of a thin film of substantially uniform thickness over the bottom isolation dielectric 2 and the spaced hills 3, constitute the two legs of thermoelectric material that electrically connect a junction at the valley bottom to the two adjacent hill-top junctions (i.e. a unit or elementary cell of a Z-device structure). The deposited doped polycrystalline silicon layer of the segments 4 and 5 may have thickness, generally comprised between 10 and 1000 nm, but may even be as thick as one or more micrometers, depending on contemplated applications, scaling of the elementary cell structure, properties of the polycrystalline semiconductor material used and design choices of the integrated TEG.

Physically, the cold and hot junctions, respectively at valley bottoms and at hill-tops or vice versa, are both constituted by metal contacts, respectively 6 and 7, electrically bridging an interruption gap between the defined end of a p-doped segment or leg 5 and the defined end of a n-doped thermoelectric segment or leg 4 of polycrystalline thin-film semiconductor, thus avoiding formation of p-n junctions along the string of elementary integration modules or cells in series of an electrically conductive line (chain) of cells.

The deposited metal layer of the junction metal contacts 6 and 7 that extend over and in electrical contact with the end portions of the two segments 4 and 5 of polycrystalline semiconductor, for a good part of their portions laying onto the substantially planar valley bottoms and hill-tops, may be of thickness ranging from about 0.1 to about 5 μm.

The cross sectional view of the drawing well represents the characteristic Z profile of the conductive legs 4 and 5 of thermoelectric material of the elementary cell.

Preferably, there is a multi-layer interfacing between the metal and the polycrystalline semiconductor thin film that is used to control the electrical interface resistance between the metal and the semiconductor materials and eventually disproportionate electrical conductivity versus thermal conductivity for reducing heat conduction toward the metallic bulk of the metal contacts, namely, the valley bottom contacts 6 and the hill-top contacts 7. An effective interfacing multi-layer may comprise a 1-50 nm film of a silicide belonging to the group: TiSi$_2$, WSi$_2$, MoSi$_2$, PtSi$_2$ and CoSi$_2$, in contact with the polycrystalline doped semiconductor, an intermediate 1-10 nm film of W or Ti and a 5-30 nm film of TiN in contact with the metal layer of Al or of Al—Si alloy or copper.

The void valley spaces among parallel lines or other arrangement of spaced hills 3 are closed at the top by a second wafer 8, provided with a thin dielectric layer 9 formed over a surface of the wafer to render it electrically non conductive, and over which are then defined metal pads 10, adapted to bond with respective hill-top metal contacts according to one of the many flip-chip bonding techniques, preferably using an aligned-bonding technique of thermo-compressive metal-to-metal bonding: Cu—Cu, W—W, Ti—Ti . . . etc., with or without diffusion layers, after a CMP planarization, or via plasma bonding (Y—Ox/Y—Ox), PECVD SiO$_2$—SiO$_2$, benzocyclobutene (BCB) to BCB bonding. Hybrid bonding techniques such as BCB and a variety of polymers or polymides, metal layers such Ti films and inter-metallic compounds (IMCs), Cu—Sn Solid-Liquid-Interdiffusion (SLID) bonding, Au—Sn or Au—In eutectic bonding, may alternately be used as well as anodic bonding or micro-bump stacking Preferably, after completion of devices manufacturing, the wafers 1 and 8 may be subjected to backside thinning process aiming to reduce the thickness of commercial wafers, including mechanical or chemical treatments, such as mechanical grinding, dry polishing, chemical-mechanical grinding, spin etching chemical-mechanical polishing and plasma dry etching. The aim is to reduce the original thickness to less than 100 µm or to ultrathin values of less than 40 µm. Thinning of the wafers reduces overall thermal resistance of the integrated out-of-plane TEG structure and makes it amenable to be deployed in next generation 3D integrated circuit.

The above features of the integrated Z-device structure may indeed be as the ones described in prior Italian patent application No. MI2014-A-001637, of the same applicant, and any pertinent content of the above identified prior patent application is intended herein incorporated by express reference.

According to this disclosure, spaced parallel line arrays of through silicon vias (TSVs) holes 11 and 12 are formed respectively through the semiconductor crystal of the substrate silicon wafer 1 and of the cover wafer 8, in geometrical projection correspondence with hill-top junction metal contacts 7 and of valley-bottom junction metal contacts 6 of every electrically conductive line of the Z-device structure and only the vias holes in geometrical projection correspondence with the hill-top junction metal contacts in the cover wafer and the vias in geometrical projection correspondence with the valley-bottom junction metal contacts in the substrate wafer are filled with copper 13 or other good heat conductor. The other vias are left empty.

Therefore, for each parallel line, the copper filled vias of the upper array of vias 11 through the cover wafer 8 and of the lower array of vias 12 of the substrate wafer 1 are not aligned with each other but offset, and similarly offset are also the empty vias.

The offset copper pillars 13, reaching close to the hill-top junction metal contacts 7 (bonded to metal pads 10) and to the valley-bottom junction metal contacts 6 create, together with the thermoelectrically active thin films line segments 4 and 5 of doped polycrystalline semiconductor, heat conduction paths of much lower thermal resistance than respective alternative conduction paths through the silicon crystal of the cover 8 and of the substrate 1 and the hills 3 of material with a comparably higher thermal resistance. The empty vias further increase the thermal resistance of these conduction paths by locally subtracting conduction cross section of crystalline silicon and distorting heat flow streamlines.

In the drawings, the multiple arrow heads symbols traced inside the in and out of the metallic pillars 13 and inside the doped thin film segments 4 and 5 are indicative of the favoured heat conduction paths (assuming that a heat source be over the top and a heat sink below the TEG device) that effectively include the thermoelectrically active legs of the cells of the multi-cellular string of an integrated TEG. The corresponding electric current paths are indicated by the arrow heads i traced alongside the doped thin film segments 4 and 5.

Figure 2:
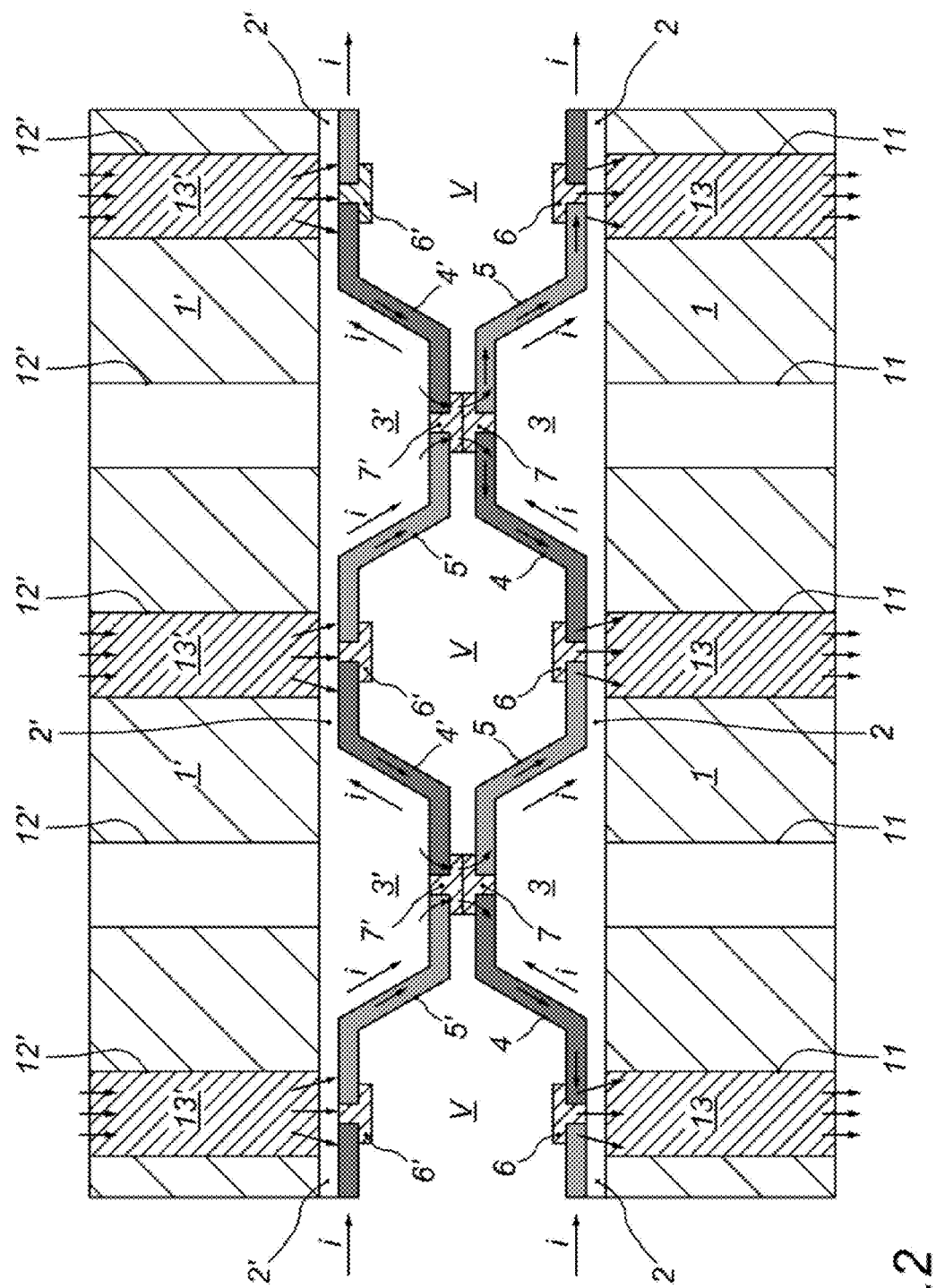
FIG. 2 is a cross sectional view of few elementary Z-device microcells of an integrated TEG of this disclosure, according to another embodiment.

Another embodiment of heat conduction paths conditioning vias in lower and upper silicon dices that delimit inner empty spaces of the integrated Z-device structure in a bivalve integrated TEG device, created by bonding together by a flip-chip bonding technique, two silicon wafers on which are respectively realized integrated Z-device structures of mirror-like geometry and inverted type of conductivity of the alternately p-doped and n-doped segments of the respective thin film lines, is illustrated in the cross sectional view of FIG. 2.

The features of the integrated Z-device structure of this alternative embodiment may indeed be similar to those of the bivalve structure described in prior Italian patent application No. MI2014-A-001712, of the same applicant, in relation to FIG. 1 thereof, and any pertinent content of the above identified prior patent application is herein incorporated by express reference.

According to this embodiment, the planar surfaces of the hill-top metal contacts 7 and 7' of the two mirror-like Z-device structures are realized on distinct silicon wafers of substrate 1 and 1' (or on the same substrate from which two of the many cut silicon dices may be eventually bonded together) that are bonded in electrical contact according to one of the many flip-chip bonding techniques, preferably using an aligned-bonding technique of thermo-compressive metal-to-metal bonding: Cu—Cu, W—W, Ti—Ti . . . etc., with or without diffusion layers, after a CMP planarization, or via plasma bonding (Y—Ox/Y—Ox), PECVD $SiO_2$—$SiO_2$, benzocyclobutene (BCB) to BCB bonding. Hybrid bonding techniques such as BCB and a variety of polymers or polymides, metal layers such Ti films and inter-metallic compounds (IMCs), Cu—Sn Solid-Liquid-Interdiffusion (SLID) bonding, Au—Sn or Au—In eutectic bonding, may alternately be used, as well as anodic bonding or micro-bump stacking.

Also the so-called smart-cut processing or the layer transfer technology SMART STACKING™ of Soitec, described in U.S. Pat. No. 5,374,564, may be used.

Aligned bonding may be carried out on whole processed wafers, from which TEG device dices are successively cut to be packaged, or alternatively on cut dices thereof. Generally, depending on the specific application, aligned bonding for realizing the TEG devices of this disclosure may be carried out in chip-to-chip, chip-to-wafer, wafer-to-wafer mode or according to chip-on-wafer-on-substrate or chip-on-chip-on-substrate approaches.

In practice, as may be observed from the cross-sectional view of the drawing, depicting the cross section of a whole elementary cell and by the adjacent semi-portions of the repetitive cell structure, the bivalve architecture produces spaced, parallel "double" lines (i.e. an upper and a lower line) of defined tracts or segments of alternately p-doped and n-doped, 4 (4') and 5 (5'), of a semiconductor material, connected by valley bottom and hill-top junction metal contacts 6 (6') and 7 (7'), orthogonally to the lines of spaced hills 3 (3') of oxide or of other dielectric, with trapezoidal cross section.

Preferably the empty valley spaces V between the spaced hills 3 (3') of the two Z-device structures, that in this exemplary embodiment have a doubled volume and height, are evacuated upon packaging a finished TEG device, for substantially eliminating thermal convection contribution there through to heat transfer from hot junction metal contacts to cold junction metal contacts along by-pass paths rather than the thermoelectrically useful heat flow paths along the semiconductor thin-film spaced parallel conductive lines of the Z-device structure.

The offset copper pillars 13', reaching close to the valley-bottom junction metal contacts 6' of the upper Z-device structure and the offset copper pillars 13, reaching close to the valley-bottom junction metal contacts 6 of the lower Z-device structure create, together with the thermoelectrically active thin film line segments 5'-4, 4'-5, 5'-4, 4'-5 of doped polycrystalline semiconductor, heat conduction paths of much lower thermal resistance than alternative conduction paths through the hills 3' and 3. The hollow vias 12' and 11 further increase the thermal resistance of these alternative conduction paths by locally subtracting conduction cross section of crystalline silicon and distorting heat flow streamlines (substantially making them longer).

Differently from the embodiment of FIG. 1, the hot and cold junctions of the functioning bivalve thermoelectric generator of FIG. 2 coincide, respectively, with the valley-bottom junction metal contacts 6 of the Z-device structure formed on the silicon substrate 1 and with the valley-bottom junction metal contacts 6' of the Z-device structure formed on the silicon substrate 1'.

The hill-top junction metal contacts 7 of the Z-device structure formed on the silicon substrate 1 and the hill-top junction metal contacts 7' of the Z-device structure formed on the silicon substrate 1', bonded together in electrical contact constitute an internal electrical node that may or may not be accessible from outside.

Figure 3:
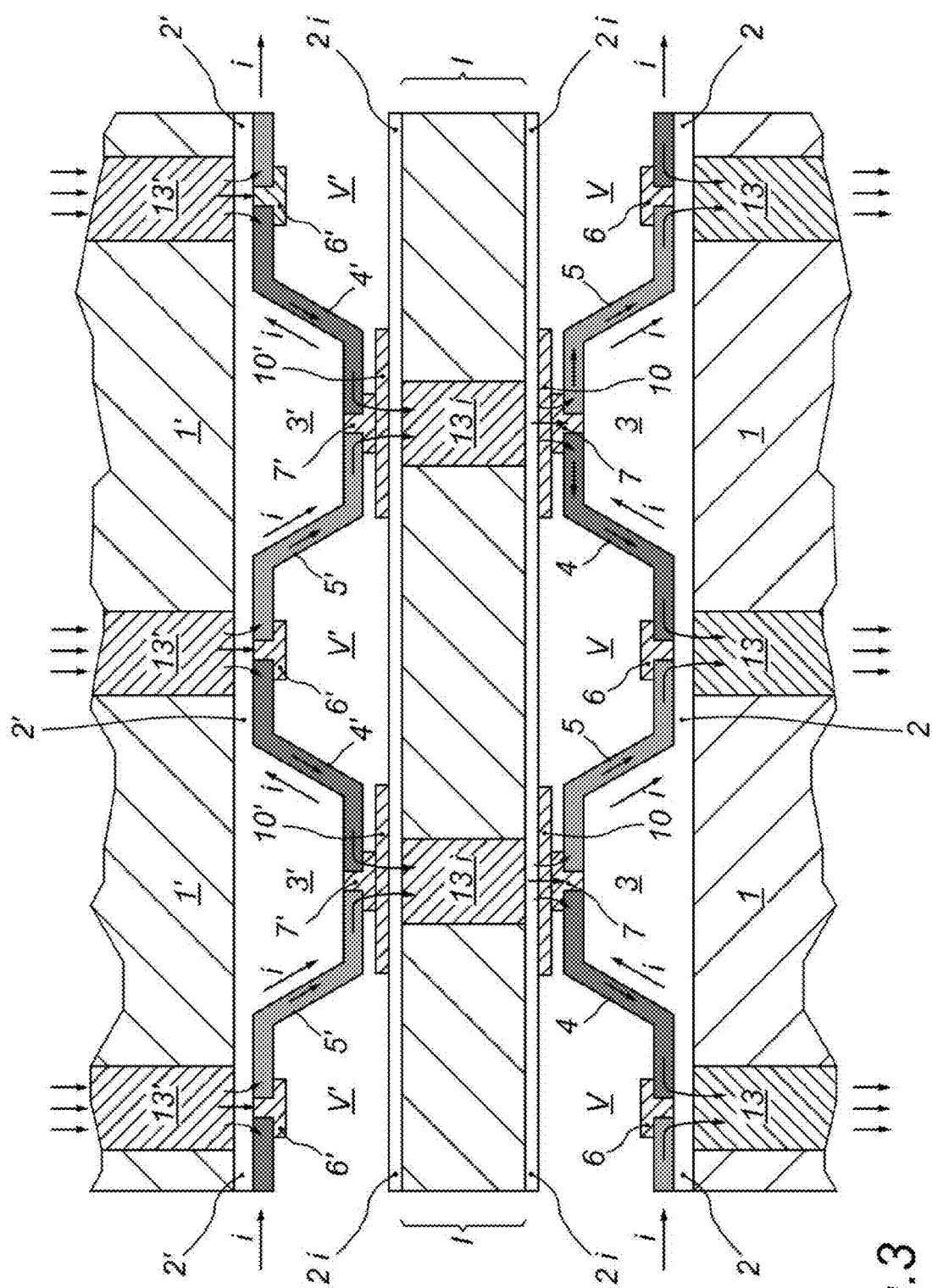
FIG. 3 is a cross sectional view of few elementary Z-device microcells of an integrated TEG of this disclosure, according to a bivalve flip-chip bonded device embodiment.

FIG. 3 shows another alternative embodiment of a bivalve integrated TEG device similar to that of FIG. 2. Instead of flip-chip bonding directly together the top metal contacts 7 and 7' of the Z-device structures of the two dices 1 and 1', a dummy dielectric interposer (or diaphragm), for example a thinned silicon wafer I with oxidized surface layers 2 and bond metal pads 10 and 10' defined on the oxidized surface layers 2i and with copper filled vias (TSVs) holes 13i, between the two dices 1 and 1'. Upon bonding with a flip-chip bonding technique the three dices, the hill-top metal contacts 7 and 7' are permanently bonded in electrical and thermal contact with the bond pads 10 and 10' of the dummy interposer I.

Figure 4:
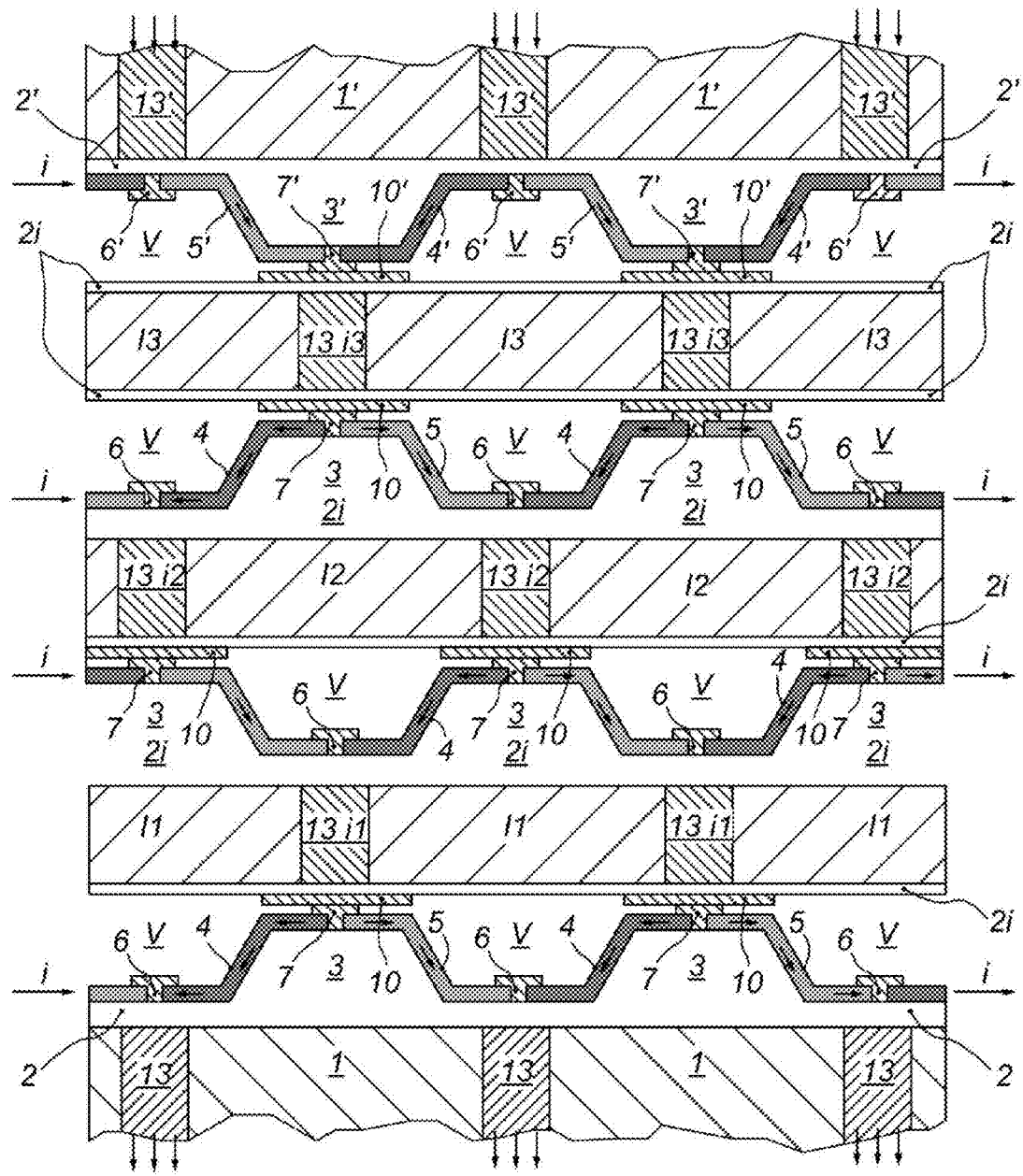
FIG. 4 is a cross sectional view of few elementary Z-device microcells of an integrated TEG of this disclosure, according to heterogeneous tri-dimensional integration by flip-chip bonding of a multichip stack device embodiment.

According to yet another embodiment, dices of integrated Z-device structures on silicon wafer substrate, are stacked in a heterogeneous 3D integration mode, as depicted in FIG. 4.

Geometrically identical Z-device structures may be fabricated on similar thinned or non thinned silicon wafers substrates 1, 1' and on interposer wafers I1 and I2. The four Z-device structures are stacked with a dummy interposer I3 underneath the upside-down cover wafer 1' (as in the embodiment of FIG. 3) to form a four-tier 3D integrated TEG device. Of course the number of tiers of the 3D integrated device may be different depending from system design considerations and applications. Any of the above indicated bonding techniques may be employed to bond the metal pads 10 of interposer wafers I1 and I2 to correspondent hill-top metal contacts 7 of the underlying Z-device structure and the bond metal pads 10 and 10' of the dummy interposer wafer I3 respectively to hill-top junction metal contacts 7 of the underlying Z-device structure of the interposer wafer I2 and to hill-top junction metal contacts 7' of the overlying Z-device structure of the upside-down cover wafer 1'.

The copper filled TSVs 13 and 13' of the lowermost silicon wafer 1 and uppermost cover silicon wafer 1' "complete" the definition, together with the thermoelectrically active thin films line segments 4-5, 5-4 and 4-5', 5-4' of doped polycrystalline semiconductor, of heat conduction paths, down through the multi-tier stack of Z-device structures, of much lower thermal resistance than respective alternative conduction paths through the silicon wafers and the hills 3 and 3' of thermally resistive material.

The invention claimed is:

1. An integrated thermoelectric generator of out-of-plane heat flux configuration on a substrate wafer of a Z-device structure, comprising:
    said substrate wafer formed from a semiconductor crystal,
    a layer of a material deposited on said substrate layer, forming hills and valleys,
    hill-top junction metal contacts and valley-bottom junction metal contacts joining juxtaposed ends of segments, alternately p-doped and n-doped, of defined thin film lines of a polycrystalline semiconductor, extending over inclined opposite flanks of said hills of said material, said material having a lower thermal conductivity than the thermal conductivity of said polycrystalline semiconductor,
    wherein all valleys among said hills of thermally insulating material are void spaces (V) defined by a cover wafer formed from a semiconductor crystal, said cover waver having a coupling surface with a dielectric film and bond metal pads or a Z-device structure of a mirror-like structural geometry of the Z-device structure of said substrate wafer defined thereon, bonded with hill-top metal contacts of the Z-device structure of the substrate wafer;
    said substrate wafer and said cover wafer have arrays of regularly spaced vias holes through the thickness of said semiconductor crystal of said substrate wafer and said cover wafer, in a geometrical projection correspondence with said metal contacts or bond metal pads;
    a heat conducting metallic filler in vias holes of said substrate wafer in geometrical projection correspondence with said valley-bottom metal contacts and in vias holes of said cover wafer in geometrical projection correspondence with bond metal pads or valley-bottom metal contacts, and
    wherein said cover wafer has identical mirror-like structural geometry of said substrate wafer, with hill-top metal contacts of said cover wafer electrically connected with respective hill-top metal contacts of said substrate wafer.

2. The integrated thermoelectric generator of claim 1, further comprising a dummy interposer wafer (I) having a dielectric film over both surfaces and bond metal pads defined on the dielectric film of both surfaces in correspondence of metal filled vias holes whereby, the respective hill-top metal contacts are permanently bonded with respective bond metal pads of the dummy interposer wafer (I).

3. The integrated thermoelectric generator of claim 2, further comprising one or more interposer wafers having a dielectric film and bond metal pads defined on the dielectric film in correspondence of metal filled vias holes, on one surface and a Z-device structure of identical mirror-like structural geometry of the Z-device structure of said substrate wafer defined on the other surface, stacked onto said substrate wafer before said dummy interposer wafer (I) and said upside-down topping cover wafer, such that hill-top contacts of all the stacked wafers bond with respective bond metal pads in correspondence of metal filled vias holes.

4. The integrated thermoelectric generator of claim 1, wherein side gaps between coupled dices are occluded so as to permanently seal said void spaces (V).

5. The integrated thermoelectric generator of claim 4, wherein said void spaces (V) are under vacuum.

6. The integrated thermoelectric generator of claim 1, wherein said wafers are thinned or ultra-thinned silicon crystal wafers.

7. The thermoelectric generator of claim 1, wherein the substrate silicon wafer and said cover wafer are micromachined wafers bonded together.

8. The thermoelectric generator of claim 1, wherein said metal contacts are of aluminium, copper, silver or alloys thereof.

9. The thermoelectric generator of claim 1, wherein said hills are of a material selected from the group consisting of silicon oxide, silicon nitride, deposited oxides of enhanced resistance to heat conduction, nanomesh structures of phononic material, and superlattices of nanoscale thin film silicon.

10. The thermoelectric generator of claim 1, wherein said hills are regularly spaced along parallel lines orthogonal to said lines of segments of polycrystalline semiconductor and have a truncated rectangular pyramid shape or a trapezoidal cross section along one axis and straight sides or flanks orthogonal to it.

11. The thermoelectric generator of claim 1, wherein electrical contact of said overlapping metal contact arms with the polycrystalline semiconductor thin film takes place via an interfacing multi-layer comprising a film of a silicide belonging to the group composed of $TiSi_2$, $WSi_2$, $MoSi_2$, $PtSi_2$ and $CoSi_2$.

12. The thermoelectric generator of claim 1, wherein electrical contact of said overlapping metal contact arms with the polycrystalline semiconductor thin film takes place via an interfacing multi-layer comprising an intermediate film of a refractory metal belonging to the group composed of W, Ti, Ta and a film of titanium nitride in contact with the metal.

* * * * *